(12) United States Patent
Chen et al.

(10) Patent No.: US 6,404,013 B1
(45) Date of Patent: Jun. 11, 2002

(54) ARRAY-TYPE LAYOUT FOR SILICON ON INSULATOR (SOI) TRANSISTOR

(75) Inventors: Shiao-Shien Chen, Chung-Li; Tien-Hao Tang, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/618,970

(22) Filed: Jul. 18, 2000

(30) Foreign Application Priority Data

Jun. 30, 2000 (TW) .......................... 089113005

(51) Int. Cl.[7] .............................................. H01L 27/10
(52) U.S. Cl. ...................... 257/347; 257/202; 257/204; 257/206
(58) Field of Search ................................ 257/347–354, 257/202, 204, 206

(56) References Cited

U.S. PATENT DOCUMENTS 5,973,368 A  * 10/1999  Pearce et al. ................ 257/368

FOREIGN PATENT DOCUMENTS

EP          747 966 A2  *  5/1996

* cited by examiner

Primary Examiner—Nathan Flynn
Assistant Examiner—Ahmed N. Sefer
(74) Attorney, Agent, or Firm—Charles C. H. Wu; Wu & Cheung, LLP

(57) ABSTRACT

An array-type layout for a silicon on insulator (SOI) transistor. A body contact region of the first conductive type is provided. A polysilicon gate structure is arranged in array over the body contact region. The polysilicon gate structure divides the body contact region into an array of alternating source regions of a second conductive type and drain regions of a second conductive type.

6 Claims, 2 Drawing Sheets

ARRAY-TYPE LAYOUT FOR SILICON ON INSULATOR (SOI) TRANSISTOR

CROSS-REFERENCE TO RELATED APPLICATION

This application claims the priority benefit of Taiwan application serial no. 89113005, filed Jun. 30, 2000.

BACKGROUND OF THE INVENTION

1. Field of the Invention

The present invention relates to a layout. More specifically, it is related to an array-type layout for silicon on insulator (SOI) transistor.

2. Description of the Related Art

Silicon on Insulator (SOI) has been so well known as a new technique. Compared to devices formed on the bulk wafer, devices formed on the (SOI) exhibit enhanced capabilities, such as low power consumption, low threshold operation and high performance.

Generally, the Silicon on Insulator lies within the wafer not far from the wafer surface and separates from the surface of the main body of the substrate. Utilizing of the wafer with SOI can help reduce latch up associated with complementary metal oxide semi-conductors (CMOS), and thus reduce the occurrence of soft error. Moreover, the wafer with SOI can raise the operational speed of the integrated circuit.

Conventional large-area diode layout usually uses finger-type layout. For SOI devices, because of the existence of a buried oxide and the application of a shallow trench isolation, difficulty in thermal dissipation encounters. As future devices become increasingly smaller, improving the effective conduction area of the devices and improving thermal dissipation and performance of the devices are important issues.

FIG. 1 is a top view of a conventional large-area SOI NMOS transistor. The layout used in FIG. 1 is a finger-like layout.

As shown in FIG. 1, a polysilicon gate structure 12 is arranged on a P+ body contact region 10. Between the polysilicon gate 12, a finger-like array of alternating N+ source region 14 and N+ drain region 16 of the second conductive type is arranged in the P+ body contact region 10.

As the schematic view of illustration 1 depicts, the width of each polysilicon gate structure 12 is W. If the operation is turned on in a uniform manner, and there are m columns, then the line width of the effective conduction area is Weff=(m−1)W.

SUMMARY OF THE INVENTION

An array-type layout for a silicon on insulator (SOI) transistor. A body contact region of the first conductive type is provided. A polysilicon gate structure is arranged in array over the body contact region. The polysilicon gate structure divides the body contact region into an array of alternating source regions of a second conductive type and drain regions of a second conductive type.

This invention is not only capable of increasing the effective conduction area of this device despite surface area limitations, it is also able to improve the performance and thermal dissipation of this device.

This invention increases the effective conduction area of conventional (SOI) devices given the present constraints on size. Furthermore, it also improves the thermal dissipation and performance of these devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 2:
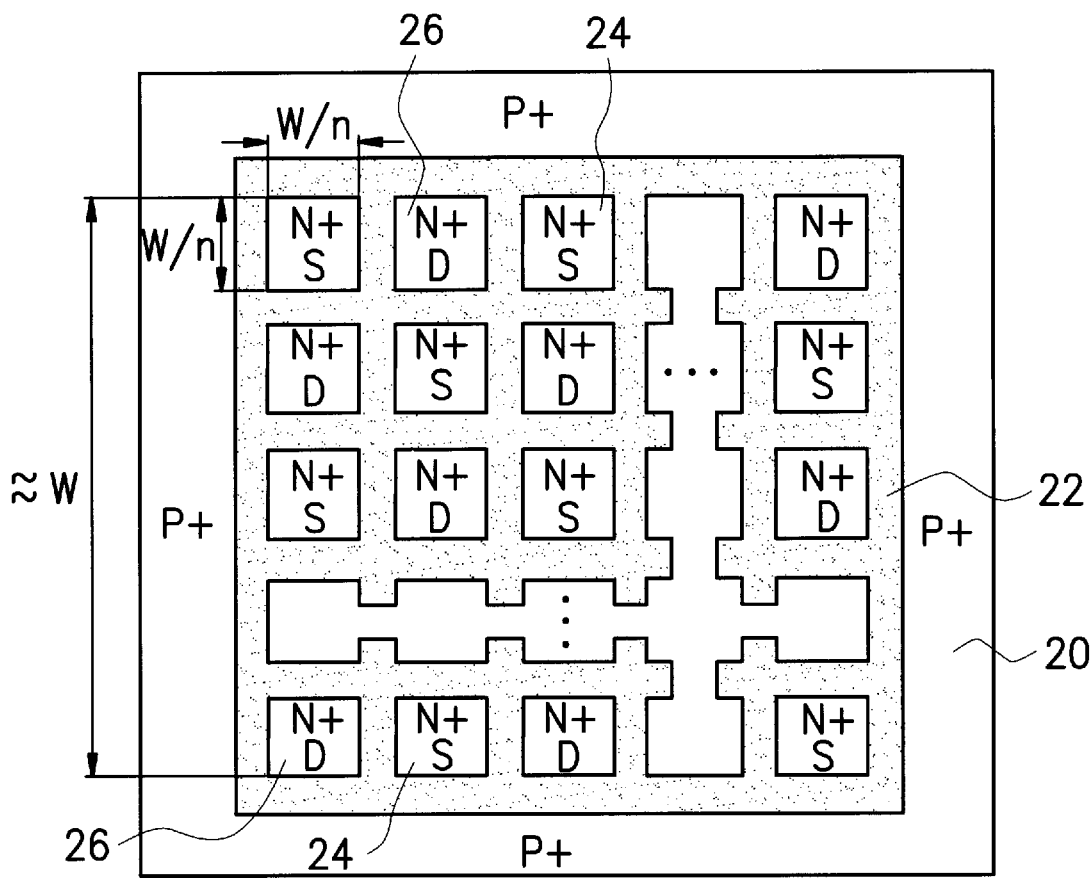
FIG. 2 is a schematic top view of an array-type layout for silicon on insulator (SOI) transistor according to a first preferred embodiment of the invention.

FIG. 2 is a schematic top view of an array-type layout for silicon on insulator (SOI) transistor according to a first preferred embodiment of the invention.

As shown in FIG. 2, a polysilicon gate structure 22 is arranged on the P+ body contact region 20. The polysilicon gate structure 22 is arranged in array over a P+ body contact region 20. The polysilicon gate structure 22 divides the P+ body contact region 20 into an array of alternating N+ source regions 24 and N+ drain regions 26.

Figure 1:
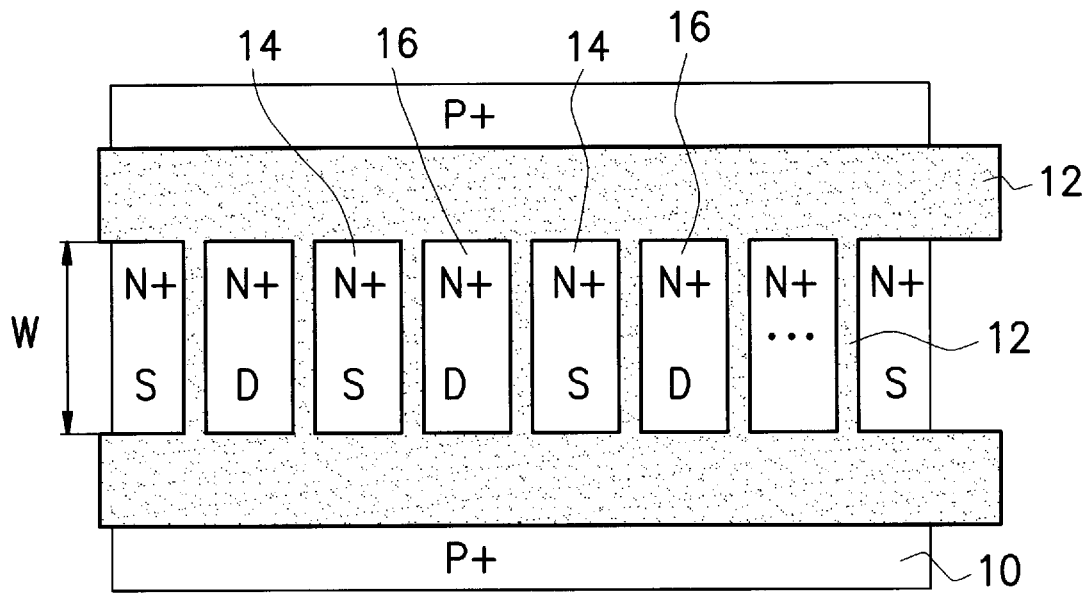
FIG. 1 is a top view of a conventional large-area SOI NMOS transistor.

If the area of FIG. 1 and the area of FIG. 2 are the same and there are m columns and n rows, then the effective conduction width is Weff=(m−1)W+Wm(n−1/n when the operation is turned on uniformly. Thus, the effective conduction width in FIG. 2 is larger than the conventional effective conduction width depicted in FIG. 1. Consequently, the effective conduction area of FIG. 2 is larger than the conventional effective conduction area depicted in FIG. 1.

Figure 3:
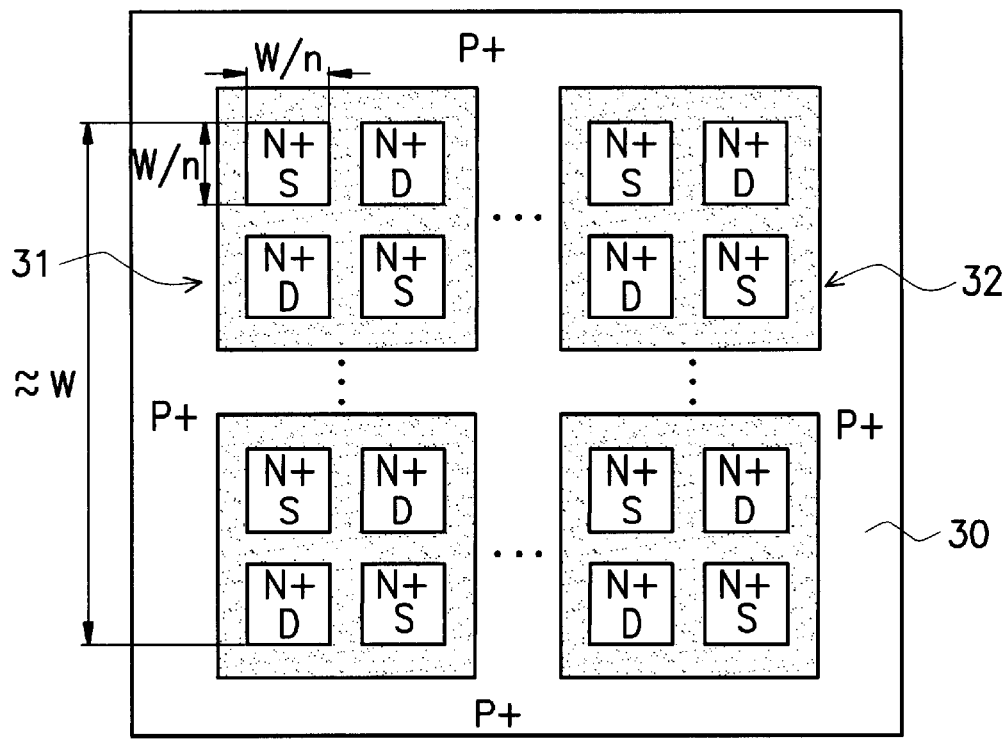
FIG. 3 is a schematic top view of an array-type layout for silicon on insulator (SOI) transistor according to a second preferred embodiment of the invention.

The layout structure in FIG. 3 is similar to that of FIG. 2. However, figure depicts the layout is divided into four N+ cells, such as a N+ cell 31 and a 32+ cell. Nevertheless, when one considers the unique manner in which array-type memory cells turn on, FIG. 2 can be transposed into the structure in FIG. 3. If the area of FIG. 3 and FIG. 1 are the same, and the outermost layer of the P+ body contact region 30 and the very small distance between cells are omitted, then the effective conduction width is $$Weff = \frac{4W}{n} \times \left(1 + \frac{n-2}{3}\right) \times \left(1 + \frac{m-2}{3}\right),$$

when the operation is turned on uniformly. Thus, the effective conduction width is larger than the effective conduction width of the FIG. 1. Consequently, the effective conduction area of FIG. 3 is larger than the conventional effective conduction area depicted in FIG. 1.

Figure 4:
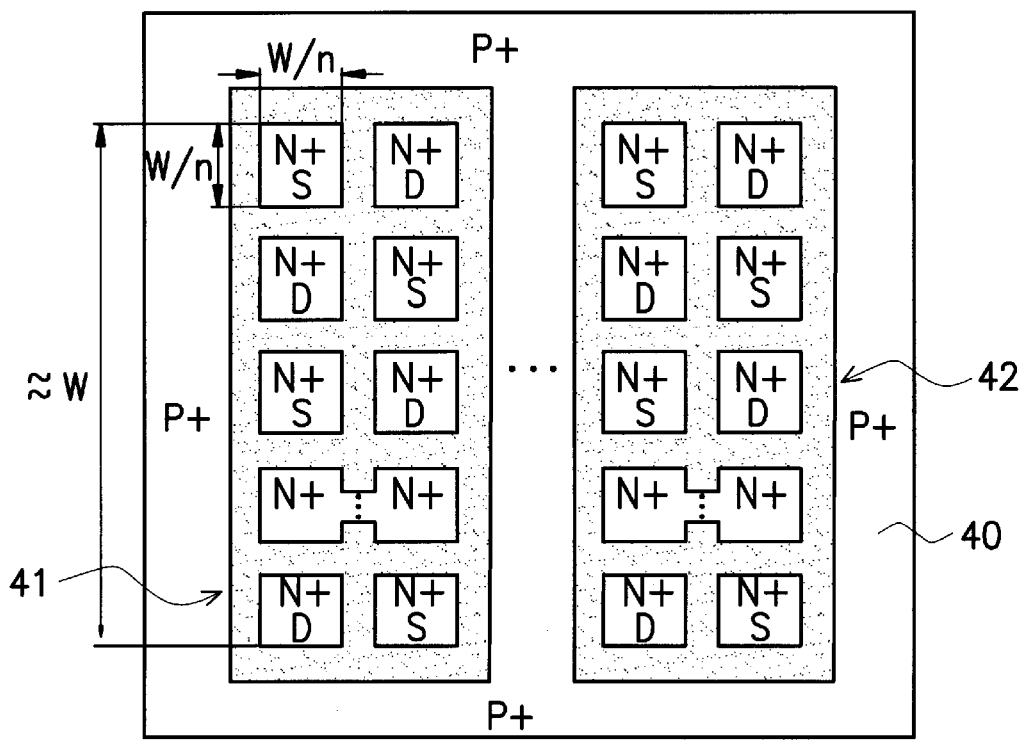
FIG. 4 is a schematic top view of an array-type layout for silicon on insulator (SOI) transistor according to a third preferred embodiment of the invention.

FIG. 4 is a schematic top view of an array-type layout for silicon on insulator (SOI) transistor according to a third preferred embodiment of the invention.

The layout structure in FIG. 4 is similar to that of FIG. 3. However, figure depicts that the layout is divided into two columns N+ cells 41 and 42. However, when one considers the unique manner in which the array type memory cells are turned on, FIG. 3 can be transposed into the structure in FIG. 4. The same as above, when the outermost layer of the P+ body contact region 40 and the very small distance between cells are omitted, then the effective conduction width is $$Weff = \frac{W}{n} \times (n + 2(n-1)) \times \left(1 + \left(\frac{m-2}{3}\right)\right),$$

when the operation is turned on uniformly. Thus, the effective conduction width of FIG. 4 is larger than the effective conduction width of FIG. 1. Consequently, the effective conduction area of FIG. 4 is larger than the conventional effective conduction area depicted in FIG. 1.

The above embodiments of the present invention takes the SOI NMOS transistors, having the P+ body contact region, the polysilicon gate, the N+ source region and the N+ drain region, as examples. The present invention can also be used in a SOI PMOS transistors that includes a N+ body contact region, a polysilicon gate, P+ source regions, and P+ drain regions. In addition, the layout structure of the present invention is not limited in the above embodiments. Any array-type SOI NMOS or PMOS transistor can be used in the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An array-type layout for a silicon on insulator (SOI) transistor, comprising:

a SOI substrate;

a body contact region of a first conductive type formed on the SOI substrate; and a polysilicon gate structure arranged in array over the body contact region, wherein the polysilicon gate structure divides the body contact region into an array of alternating source regions of a second conductive type and drain regions of a second conductive type, wherein the source regions and the drain regions are surrounded by the polysilicon gate structure.

2. The array-type layout for SOI transistor of claim 1, wherein when the first conductive type is a P type, the second conductive type is an N type.

3. The array-type layout for SOI transistor of claim 1, wherein when the first conductive type is an N type, the second conductive type is a P type.

4. An array-type layout for a silicon on insulator (SOI) transistor, comprising:

a body contact region of the first conductive type; and a polysilicon gate structure arranged over the body contact region, wherein the polysilicon gate structure is divided into asymmetric array-type layout regions, that is, a first array region and a second array region, and the first array region and the second array region divide the body contact region into an array of alternating source regions of a second conductive type and drain regions of a second conductive type.

5. The array-type layout for SOI transistor of claim 4, wherein when the first conductive type is a P type, the second conductive type is an N type.

6. The array-type layout for SOI transistor of claim 4, wherein when the first conductive type is an N type, the second conductive type is a P type.

* * * * *